United States Patent
Tseng et al.

(10) Patent No.: US 11,410,971 B2
(45) Date of Patent: Aug. 9, 2022

(54) CHIP PACKAGE STRUCTURE

(71) Applicant: Unimicron Technology Corp., Taoyuan (TW)

(72) Inventors: Tzyy-Jang Tseng, Taoyuan (TW); Pu-Ju Lin, Hsinchu (TW); Cheng-Ta Ko, Taipei (TW); Ra-Min Tain, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 33 days.

(21) Appl. No.: 17/098,436

(22) Filed: Nov. 15, 2020

(65) Prior Publication Data

US 2022/0059498 A1 Feb. 24, 2022

(30) Foreign Application Priority Data

Aug. 20, 2020 (TW) .................. 109128362

(51) Int. Cl.
| | |
|---|---|
| *H01L 25/065* | (2006.01) |
| *H01L 23/538* | (2006.01) |
| *H01L 23/498* | (2006.01) |
| *H01L 23/48* | (2006.01) |
| *H01L 23/00* | (2006.01) |

(52) U.S. Cl.
CPC ........ *H01L 25/0655* (2013.01); *H01L 23/481* (2013.01); *H01L 23/49816* (2013.01); *H01L 23/5381* (2013.01); *H01L 24/16* (2013.01); H01L 2224/16227 (2013.01)

(58) Field of Classification Search
CPC ............... H01L 25/0655; H01L 23/481; H01L 23/49816
See application file for complete search history.

(56) References Cited

U.S. PATENT DOCUMENTS 8,227,904 B2  7/2012  Braunisch et al.
2016/0066423 A1  3/2016  Sakamoto et al.
(Continued)

FOREIGN PATENT DOCUMENTS

TW  201841328  11/2018
WO  2018063316  4/2018

OTHER PUBLICATIONS

Pu-Ju Lin et al., "Chip Package Structure and Manufacturing Method Thereof", Unpublished U.S. Appl. No. 16/687,557, filed Nov. 18, 2019.

*Primary Examiner* — Errol V Fernandes
(74) *Attorney, Agent, or Firm* — JCIPRNET

(57) ABSTRACT

A chip package structure includes a substrate, a first chip, a second chip, a bridge, a plurality of first bumps, a plurality of second bumps, a plurality of third bumps and a plurality of solder balls. A first active surface of the first chip and a second active surface of the second chip face a first surface of the substrate. The bridge includes a high-molecular polymer layer and a pad layer located on the high-molecular polymer layer. The first chip is electrically connected to the substrate through the first bumps. The second chip is electrically connected to the substrate through the second bumps. The first chip and the second chip are electrically connected to the pad layer through the third bumps. The first bumps and the second bumps have the same size. The solder balls are disposed on a second surface of the substrate and electrically connected to the substrate.

11 Claims, 6 Drawing Sheets

(56) References Cited

U.S. PATENT DOCUMENTS

| | | | |
|---|---|---|---|
| 2016/0293572 A1 | 10/2016 | We et al. | |
| 2017/0365580 A1* | 12/2017 | Shih | H01L 25/0652 |
| 2019/0304809 A1* | 10/2019 | Raorane | H01L 25/0655 |
| 2019/0304912 A1* | 10/2019 | Ecton | H01L 23/5381 |
| 2019/0385977 A1 | 12/2019 | Elsherbini et al. | |
| 2020/0058627 A1* | 2/2020 | Chen | H01L 23/3135 |
| 2020/0075546 A1* | 3/2020 | Shih | H01L 23/3135 |
| 2021/0193637 A1* | 6/2021 | Jeng | H01L 23/5384 |

* cited by examiner

CHIP PACKAGE STRUCTURE

CROSS-REFERENCE TO RELATED APPLICATION

This application claims the priority benefit of Taiwan application no. 109128362, filed on Aug. 20, 2020. The entirety of the above-mentioned patent application is hereby incorporated by reference herein and made a part of this specification.

TECHNICAL FIELD

The invention relates to a package structure, and more particularly, to a chip package structure.

BACKGROUND

At present, in a package structure where multiple chips are interconnected, the embedded multi-die interconnect bridge (EMIB) technology is used to place chips on a circuit carrier and a silicon bridge embedded in the circuit carrier is used to connect the chips. However, due to the manufacturing process of the silicon bridge, a size of the pads will be significantly smaller than a size of pads on a general circuit board. As a result, a size of micro bumps between the silicon bridge and the chips (e.g., 55 microns) is different from a size of micro bumps between the chips and a circuit substrate (e.g., 130 microns), resulting in a poor chip assembly yield rate.

SUMMARY

The invention provides a chip packaging structure whose bumps are all the same in size, which can effectively solve the problem of low assembly yield rate of conventional chips, and can have better structural reliability.

The chip package structure of the invention includes a substrate, a first chip, a second chip, a bridge, a plurality of first bumps, a plurality of second bumps, a plurality of third bumps and a plurality of solder balls. The substrate has a first surface and a second surface opposite to each other. The first chip is disposed on the first surface of the substrate, has a first active surface facing the first surface, and includes a plurality of first pads disposed on the first active surface. The second chip is disposed on the first surface of the substrate, has a second active surface facing the first surface, and includes a plurality of second pads disposed on the second active surface. The bridge includes a high-molecular polymer layer and a pad layer located on the high-molecular polymer layer. The first bumps are disposed between the first chip and the substrate. The first chip is electrically connected to the substrate through the first bumps. The second bumps are disposed between the second chip and the substrate. The second chip is electrically connected to the substrate through the second bumps. The third bumps are disposed between the first chip and the bridge and between the second chip and the bridge. The first chip and the second chip are electrically connected to the pad layer of the bridge through the third bumps. The first bumps and the second bumps have the same size. The solder balls are disposed on a second surface of the substrate and electrically connected to the substrate.

In an embodiment of the invention, a size of the third bumps is the same as a size of the first bumps.

In an embodiment of the invention, a size of the third bumps is different from a size of the first bumps.

According to an embodiment of the invention, the first chip includes at least one first through silicon via, and the second chip includes at least one second through silicon via. The first chip and the second chip are located between the bridge and the substrate, and the bridge is electrically connected to the first through silicon via and the second through silicon via.

In an embodiment of the invention, an orthogonal projection of the bridge on the substrate partially overlaps with an orthogonal projection of the first chip and the second chip on the substrate.

In an embodiment of the invention, the chip package structure further includes a first redistribution circuit layer. The first redistribution circuit layer is disposed on the first surface of the substrate, and located between the first chip and the substrate and between the second chip and the substrate. The first chip is electrically connected to the substrate through the first bumps and the first redistribution circuit layer.

In an embodiment of the invention, the chip package structure further includes a second redistribution circuit layer. The second redistribution circuit layer is disposed on the second surface of the substrate, and located between the substrate and the solder balls. The solder balls are electrically connected to the substrate through the second redistribution circuit layer. The substrate includes at least one conductive via electrically connected to the first redistribution circuit layer and the second redistribution circuit layer. The second chip is electrically connected to the substrate through the second bumps and the second redistribution circuit layer.

In an embodiment of the invention, the chip package structure further includes a chip set. The chip set is disposed on the bridge, and electrically connected to the first through silicon via of the first chip through the bridge and the third bumps.

In an embodiment of the invention, the chip package structure further includes an integrated passive element. The integrated passive element is disposed on the bridge, and electrically connected to the second through silicon via of the second chip through the bridge and the third bumps.

In an embodiment of the invention, the chip package structure further includes a first redistribution circuit layer. The first redistribution circuit layer is disposed on the first surface of the substrate, and the bridge and the first redistribution circuit layer are located between the first chip and the substrate and between the second chip and the substrate. The first chip is electrically connected to the substrate through the first bumps and the first redistribution circuit layer.

In an embodiment of the invention, the chip package structure further includes a second redistribution circuit layer. The second redistribution circuit layer is disposed on the second surface of the substrate, and located between the substrate and the solder balls. The solder balls are electrically connected to the substrate through the second redistribution circuit layer. The substrate includes at least one first conductive via electrically connected to the first redistribution circuit layer and the second redistribution circuit layer. The second chip is electrically connected to the substrate through the second bumps and the second redistribution circuit layer.

In an embodiment of the invention, the bridge is embedded in the first redistribution circuit layer or disposed on the first redistribution circuit layer.

In an embodiment of the invention, the first redistribution circuit layer includes at least one second conductive via electrically connected to the bridge and the substrate.

Based on the above, in the chip package structure of the invention, the sizes of the bumps are the same between each chip and the substrate. Because the first bumps and the second bumps have the same size, the assembly yield rate of the chips can be improved, and the chip package structure of the invention can have better structural reliability.

To make the aforementioned more comprehensible, several embodiments accompanied with drawings are described in detail as follows.

DETAILED DESCRIPTION

Figure 1:
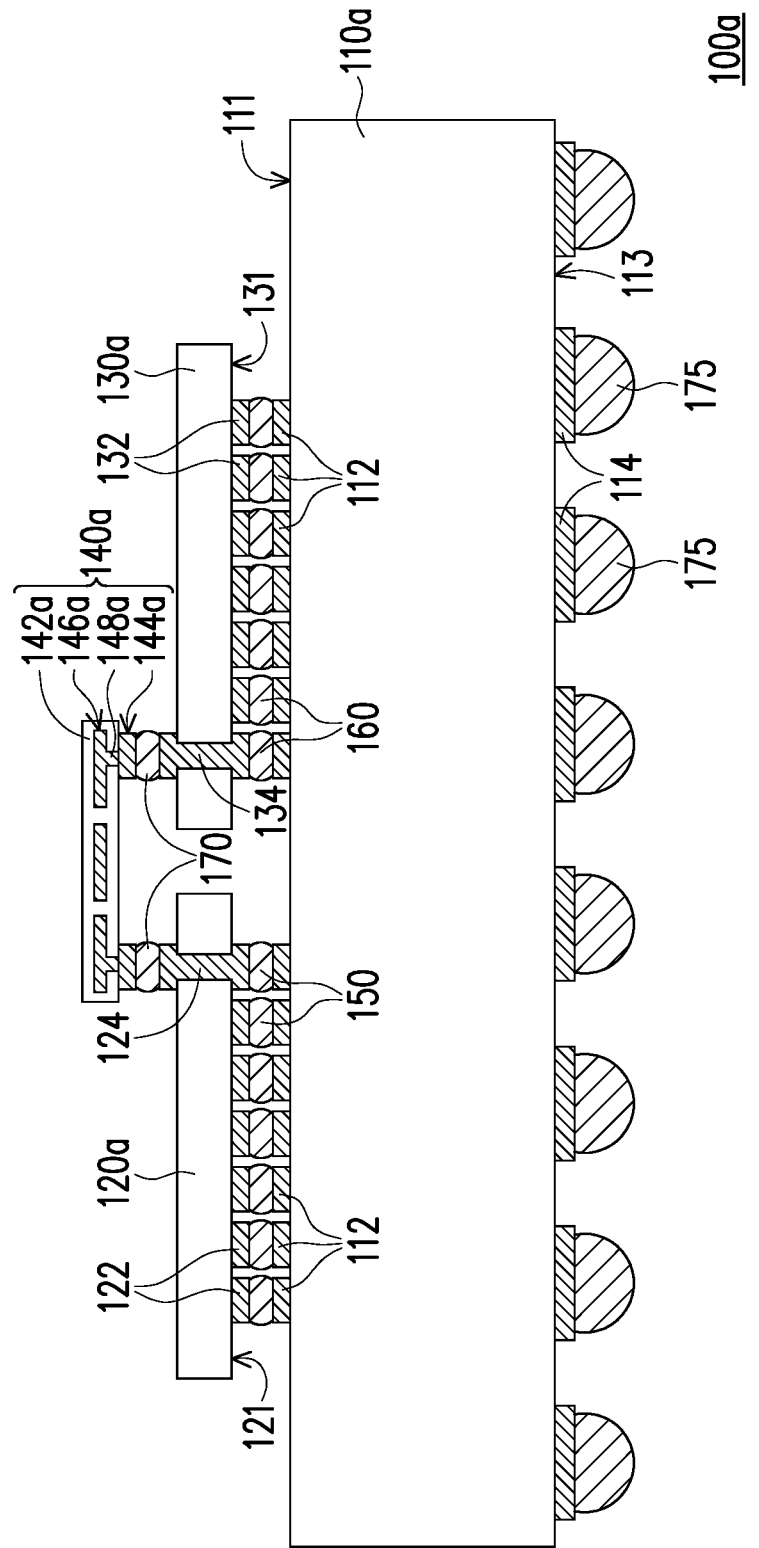
FIG. 1 is a schematic cross-sectional view of a chip package structure according to an embodiment of the invention.

FIG. 1 is a schematic cross-sectional view of a chip package structure according to an embodiment of the invention. Referring to FIG. 1, in this embodiment, a chip package structure 100a includes a substrate 110a, a first chip 120a, a second chip 130a, a bridge 140a, a plurality of first bumps 150, a plurality of second bumps 160, a plurality of third bumps 170 and a plurality of solder balls 175. Since the chip package structure 100a of this embodiment includes the first chip 120a and the second chip 130a, the chip package structure 100a is a multi-chip chip package structure.

Specifically, the substrate 110a of this embodiment has a first surface 111 and a second surface 113 opposite to each other, and includes pads 112 disposed on the first surface 111 and pads 114 disposed on the second surface 113. That is, the substrate 110a of this embodiment is embodied as a circuit substrate. A material of the substrate 110a is, for example, glass or organic material, and a material of the pads 112 and 114 is, for example, copper, but not limited to thereto. In this embodiment, the pads 112 and 114 are disposed on the first surface 111 and the second surface 113, respectively. However, in other embodiments, it is possible that the pads 112 and 114 are embedded in the substrate 110a, and such configuration also falls in the scope of the invention for which protection is sought.

Further, the first chip 120a of this embodiment is disposed on the first surface 111 of the substrate 110a, has a first active surface 121 facing the first surface 111, and includes a plurality of first pads 122 disposed on the first active surface 121. The second chip 130a is disposed on the first surface 111 of the substrate 110a, has a second active surface 131 facing the first surface 111, and includes a plurality of second pads 132 disposed on the second active surface 131. Here, the properties of the first chip 120a are the same as those of the second chip 130a. For example, both the first chip 120a and the second chip 130a may be logic chips, but not limited thereto. In another embodiment, the properties of the first chip 120a may be different from those of the second chip 130a. That is, the first chip 120a may be a logic chip while the second chip 130a may be a memory chip (which means heterogeneous chips are integrated into one single module), but not limited to thereto.

Referring to FIG. 1, in this embodiment, the bridge 140a includes a high-molecular polymer layer 142a and a pad layer 144a located on the high-molecular polymer layer 142a. That is, the bridge 140a of this embodiment is not based on silicon, but based on a high molecular polymer (such as polyimide (PI), but not limited to thereto). More specifically, the bridge 140a of this embodiment further includes at least one patterned circuit layer 146a (one patterned circuit layer 146a is schematically shown) and at least one conductive via 148a (multiple conductive vias 148a are schematically shown). The patterned circuit layer 146a is embedded in the high-molecular polymer layer 142a, and electrically connected to the pad layer 144a through the conductive vias 148a. In the manufacturing process, first, a glass substrate is provided and a release film is formed on the glass substrate. Next, the high-molecular polymer layer 142a, the patterned circuit layer 146a, the conductive vias 148a and the pad layer 144a are formed on the release film, so as to form the bridge 140a. Here, the bridge 140a may be regarded as a redistribution circuit layer bridge (RDL bridge). The line width and the line spacing of the patterned circuit layer 146a and the pad layer 144a are, for example, 2 μm to 5 μm, respectively. Since the glass substrate has a high level of flatness and strength, the bridge 140a with ultra-fine circuits can be fabricated on the glass substrate to provide the effect of high-density connection.

In addition, the first bump 150 of this embodiment is disposed between the first chip 120a and the substrate 110a. The first chip 120a is electrically connected to the substrate 110a through the first bumps 150. That is, the first pads 122 of the first chip 120a are electrically connected to the pads 112 of the substrate 110a through the first bumps 150. The second bumps 160 are disposed between the second chip 130a and the substrate 110a. The second chip 130a is electrically connected to the substrate 110a through the second bumps 160. That is, the second pads 132 of the second chip 130a are electrically connected to the pads 112 of the substrate 110a through the second bumps 160. The third bumps 170 are disposed between the first chip 120a and the bridge 140a and between the second chip 130a and the bridge 140a. The first chip 120a and the second chip 130a are electrically connected to the pad layer 144a of the bridge 140a through the third bumps 170.

More specifically, referring to FIG. 1, the first chip 120a of this embodiment includes at least one first through silicon via 124 (one first through silicon via 124 is schematically shown), and the second chip 130a of this embodiment includes at least one second through silicon via 134 (one second through silicon via 134 is schematically shown). The first chip 120a and the second chip 130a are located between the bridge 140a and the substrate 110a, and the bridge 140a is electrically connected to the first through silicon via 124 and the second through silicon via 134 through the third bumps 170. That is, the pad layer 144a of the bridge 140a is electrically connected to the first through silicon via 124 of the first chip 120a and the second through silicon via 134 of the second chip 130a through the third bumps 170. Here, an orthogonal projection of the bridge 140a on the substrate 110a partially overlaps with an orthogonal projection of the first chip 120a and the second chip 130a on the substrate 110a.

In particular, the first bumps 150 and the second bumps 160 have the same size. That is, the size and shape of the first bumps 150 and the second bumps 160 are the same. The first bumps 150 and the second bumps 160 may be, for example, micro bumps (e.g., 20 µm to 60 µm). A size of the third bumps 170 and the size of the first bumps 150 may be the same or different. The size of the third bumps 170 may be, for example, 20 µm to 200 µm. In the manufacturing process, the first bumps 150 and the second bumps 160 are first formed on the first chip 120a and the second chip 130a. Next, the first chip 120a and the second chip 130a are bonded to the substrate 110a. Afterwards, the third bumps 170 are formed on the first through silicon via 124 of the first chip 120a and the second through silicon via 134 of the second chip 130a. Finally, the bridge 140a is bonded to the first chip 120a and the second chip 130a.

Since the first bumps 150 and the second bumps 160 of this embodiment have the same size, when the first chip 120a and the second chip 130a are assembled with the substrate 110a, there is no need to consider the size of the connected bumps, and the assembly yield rate can be higher. Accordingly, the structural reliability of the chip package structure 100a can be improved. In addition, the solder balls 175 are disposed on the second surface 113 of the substrate 110a and electrically connected to the substrate 110a. The chip package structure 100a can be electrically connected to external circuits through the solder balls 175.

In brief, in the chip package structure 100a of this embodiment, since the first bumps 150 and the second bumps 160 have the same size, the assembly yield rate of the first chip 120a and the second chip 130a can be improved. Accordingly, the chip package structure 100a of this embodiment can have better structural reliability. In addition, if the properties of the first chip 120a are different from the properties of the second chip 130a, it means that the chip package structure 100a of this embodiment can integrate heterogeneous components into one single module.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2:
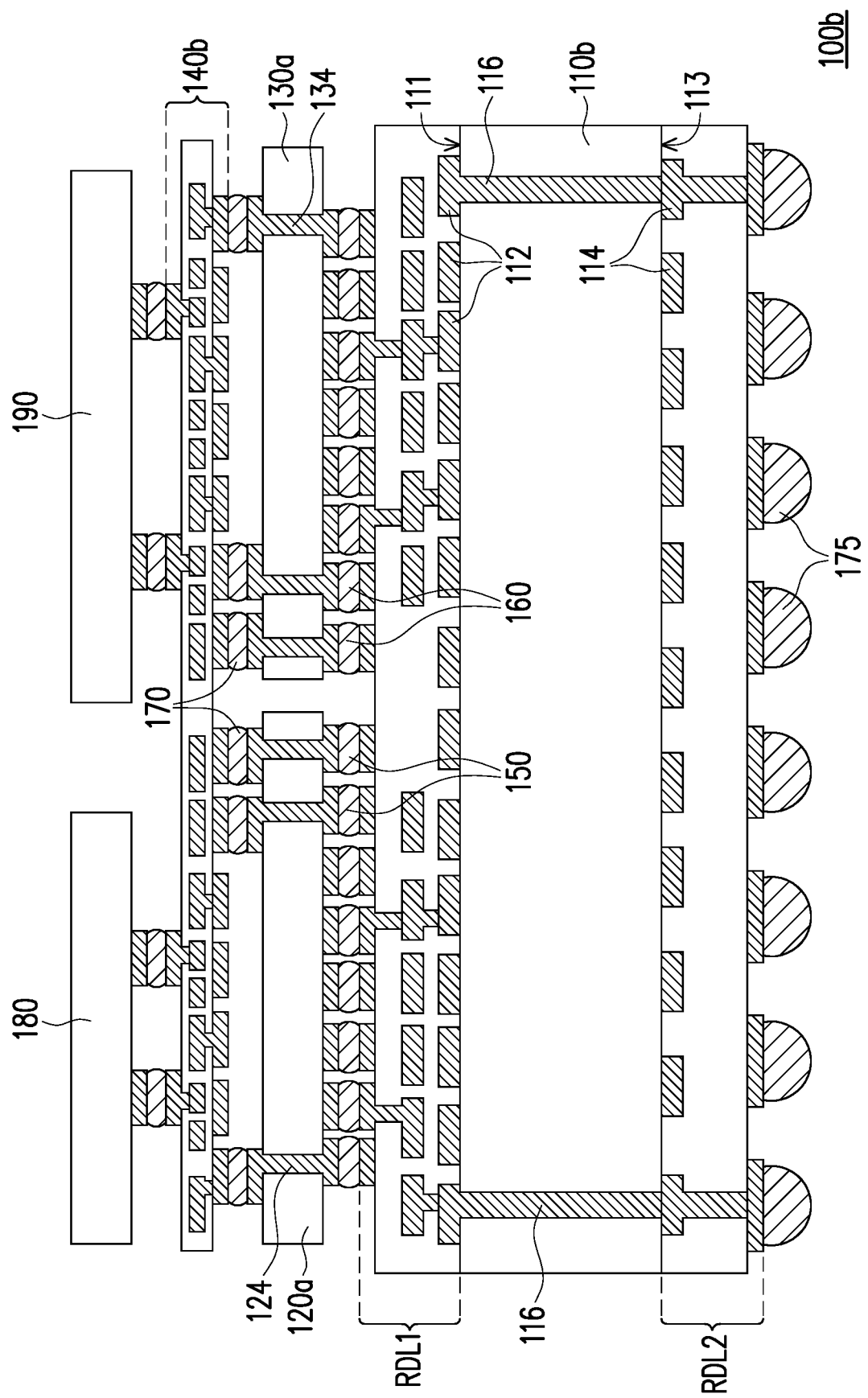
FIG. 2 is a schematic cross-sectional view of a chip package structure according to another embodiment of the invention.

FIG. 2 is a schematic cross-sectional view of a chip package structure according to another embodiment of the invention. Referring to FIG. 1 and FIG. 2 together, a chip package structure 100b of this embodiment is similar to the chip package structure 100a of FIG. 1 but differs in that, the chip package structure 100b of this embodiment further includes a first redistribution circuit layer RDL1. The first redistribution circuit layer RDL1 is disposed on the first surface 111 of a substrate 110b, and located between the first chip 120a and the substrate 110b and between the second chip 130a and the substrate 110b. The first redistribution circuit layer RDL1 covers the first surface 111 and the pads 112 of the substrate 110b, and the first chip 120a is electrically connected to the substrate 110b through the first bumps 150 and the first redistribution circuit layer RDL1. The second chip 130a is electrically connected to the substrate 110b through the second bumps 160 and a second redistribution circuit layer RDL2. Further, as shown in FIG. 2, the chip package structure 100b of this embodiment may further include the second redistribution circuit layer RDL2. The second redistribution circuit layer RDL2 is disposed on the second surface 113 of the substrate 110b, and located between the substrate 110b and the solder balls 175. The solder balls 175 are electrically connected to the substrate 110b through the second redistribution circuit layer RDL2.

In addition, the substrate 110b of this embodiment further includes at least one conductive via 116 (multiple conductive vias 116 are schematically shown). The conductive vias 116 are electrically connected to the first redistribution circuit layer RDL1 and the second redistribution circuit layer RDL2. Further, as shown in FIG. 2, the chip package structure 100b of this embodiment further includes a chip set 180. The chip set 180 is disposed on a bridge 140b, and electrically connected to the first through silicon via 124 of the first chip 120a through the bridge 140b and the third bumps 170. In addition, the chip package structure 100 of the present embodiment may further include an integrated passive element 190. The integrated passive element 190 is disposed on the bridge 140b, and electrically connected to the second through silicon via 134 of the second chip 130a through the bridge 140b and the third bumps 170. Here, the properties of the first chip 120a are the same as those of the second chip 130a. The first chip 120a and the second chip 130a may be, for example, logic chips, radio frequency chips, memories, or system-on-chips (SoC) of network-on-chip (NoC), but not limited thereto.

In short, the chip package structure 100b of this embodiment achieves a heterogeneous integration of the chip set 180 and the integrated passive element 190 into one single module through the first through silicon via 124 of the first chip 120a and the second through silicon via 134 of the second chip 130a.

Figure 3:
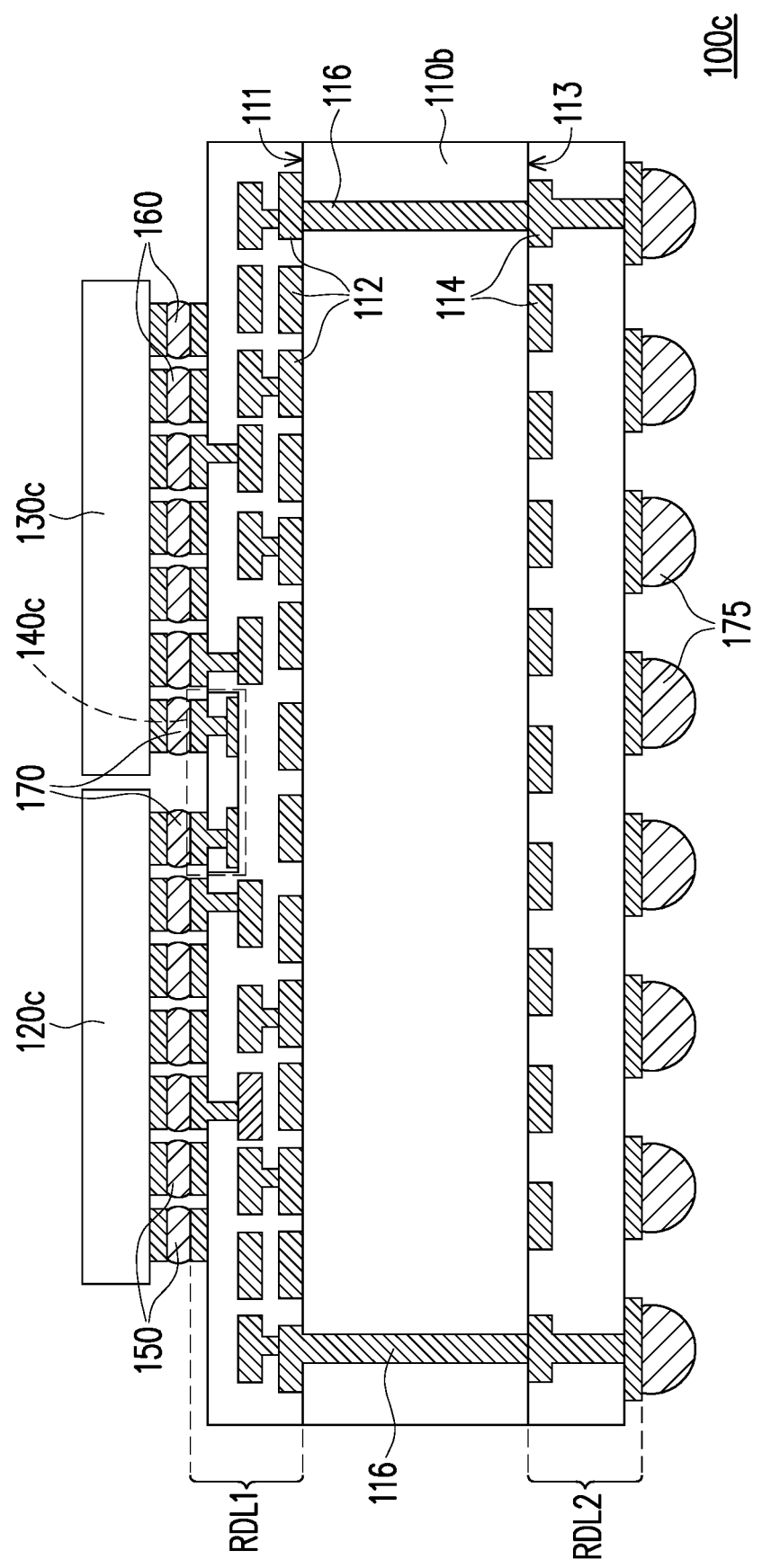
FIG. 3 is a schematic cross-sectional view of a chip package structure according to another embodiment of the invention.

FIG. 3 is a schematic cross-sectional view of a chip package structure according to another embodiment of the invention. Referring to FIG. 1 and FIG. 3 together, a chip package structure 100c of this embodiment is similar to the chip package structure 100a of FIG. 1 but differs in that, in this embodiment, the size of the first bump 150, the size of the second bump 160, and the size of the third bump 170 are the same. Moreover, the chip package structure 100c of this embodiment further includes the first redistribution circuit layer RDL1. The first redistribution circuit layer RDL1 is disposed on the first surface 111 of the substrate 110b, and a bridge 140c and the first redistribution circuit layer RDL1 are located between a first chip 120c and the substrate 100 and between a second chip 130c and the substrate 110b. More specifically, because the bridge 140c of this embodiment is embedded in the first redistribution circuit layer RDL1, an overall thickness of the chip package structure 100c can be reduced. The first chip 120c is electrically connected to the substrate 110b through the first bumps 150 and the first redistribution circuit layer RDL1. Furthermore, the chip package structure 100c of this embodiment further includes the second redistribution circuit layer RDL2. The second chip 130c is electrically connected to the substrate 110b through the second bumps 160 and the second redistribution circuit layer RDL2. Here, as shown in FIG. 3, neither the first chip 120c nor the second chip 130c is provided with a through silicon via structure. The second redistribution circuit layer RDL2 is disposed on the second surface 113 of the substrate 110b, and located between the substrate 110b and the solder balls 175. The solder balls 175 are electrically connected to the substrate 110b through the second redistribution circuit layer RDL2. In addition, the substrate 110b of this embodiment further includes at least one first conductive via 116 (multiple conductive vias 116 are schematically shown) electrically connected to the first redistribution circuit layer RDL1 and the second redistribution circuit layer RDL2.

In the manufacturing process, the first bumps 150, the second bumps 160 and the third bumps 170 are first formed on the first chip 120c and the second chip 130c. Next, the first chip 120c and the second chip 130c are bonded to the substrate 110b and the bridge 140c. Since the first bumps 150, the second bumps 160 and the third bumps 170 of this embodiment have the same size, when the first chip 120c and the second chip 130c are assembled with the substrate 110b and the bridge 140c, there is no need to consider the size of the connected bumps, and the assembly yield rate can be higher. Accordingly, the structural reliability of the chip package structure 100c can be improved.

Figure 4:
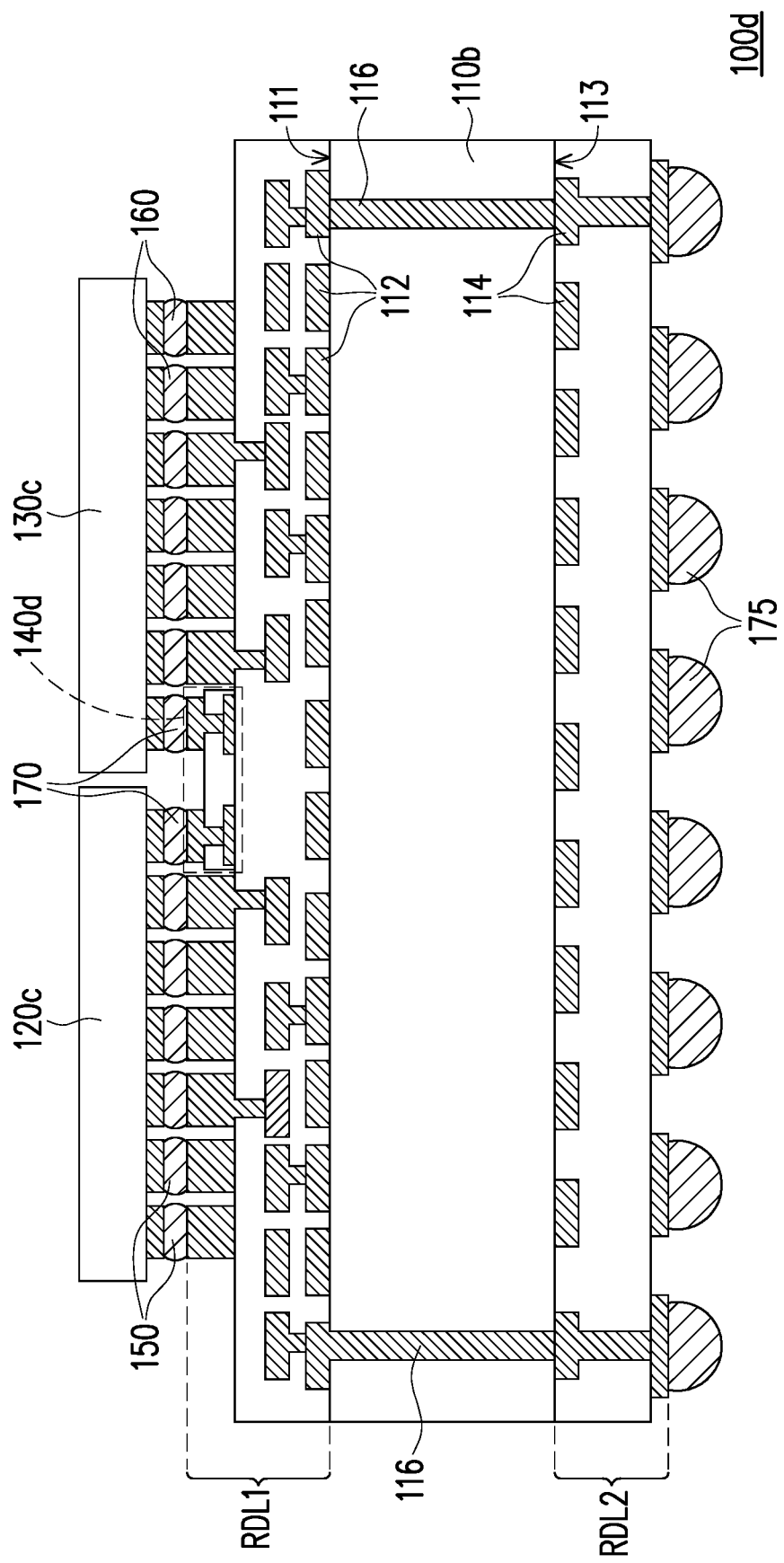
FIG. 4 is a schematic cross-sectional view of a chip package structure according to another embodiment of the invention.

FIG. 4 is a schematic cross-sectional view of a chip package structure according to another embodiment of the invention. Referring to FIG. 3 and FIG. 4 together, a chip package structure 100d of this embodiment is similar to the chip package structure 100c of FIG. 3 but differs in that, in this embodiment, a bridge 140d is disposed on the first redistribution circuit layer RDL1.

Figure 5:
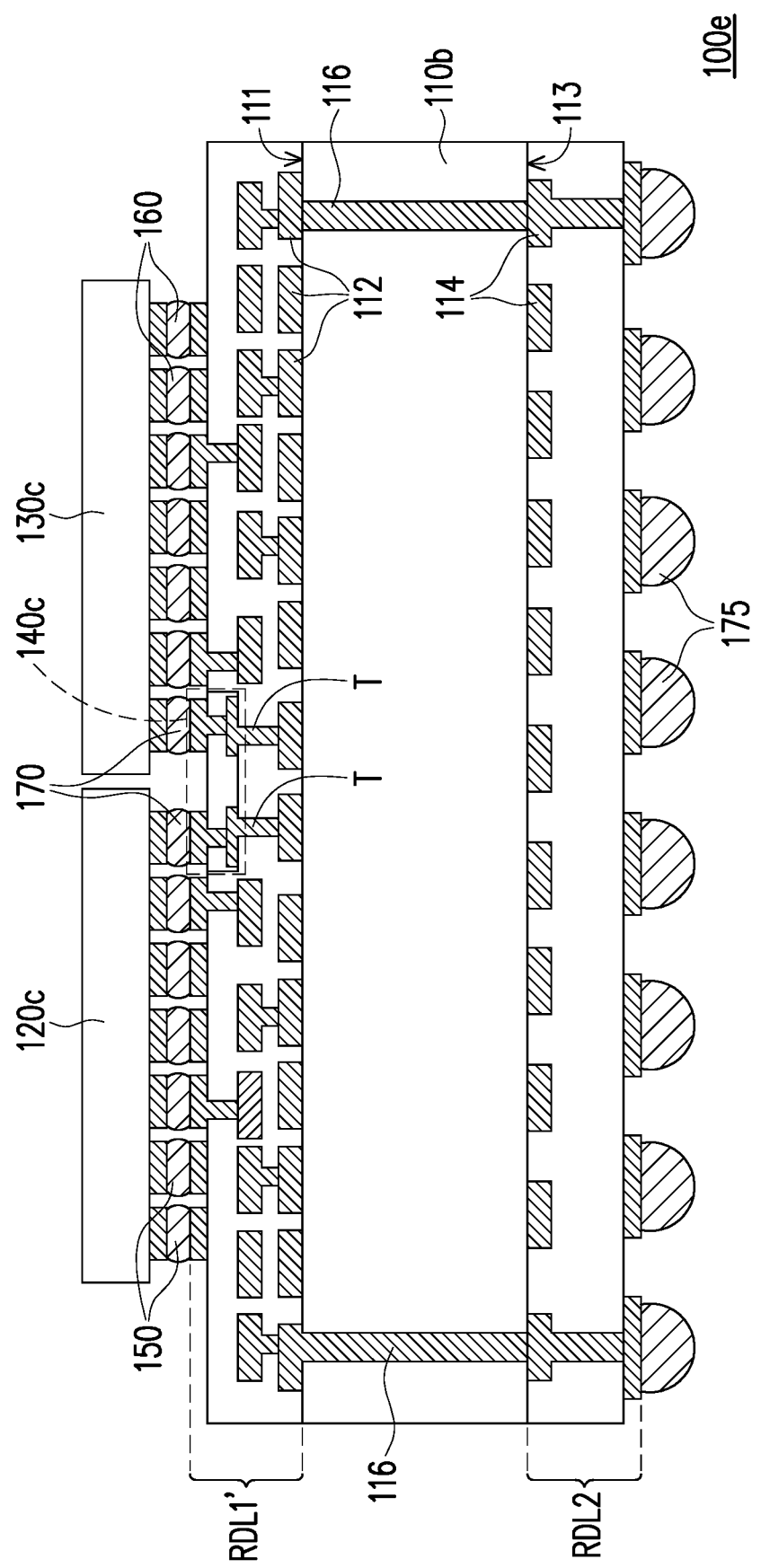
FIG. 5 is a schematic cross-sectional view of a chip package structure according to another embodiment of the invention.

FIG. 5 is a schematic cross-sectional view of a chip package structure according to another embodiment of the invention. Referring to FIG. 3 and FIG. 5 together, a chip package structure 100e of this embodiment is similar to the chip package structure 100c of FIG. 3 but differs in that, in this embodiment, a first redistribution circuit layer RDL1' includes at least one second conductive via T (two conductive vias T are schematically shown). The second conductive vias T are electrically connected to the bridge 140c and the pads 112 of the substrate 110b. In other words, since the substrate 110b of this embodiment may be electrically connected to the bridge 140c through the second conductive vias T, a design flexibility can be improved.

Figure 6:
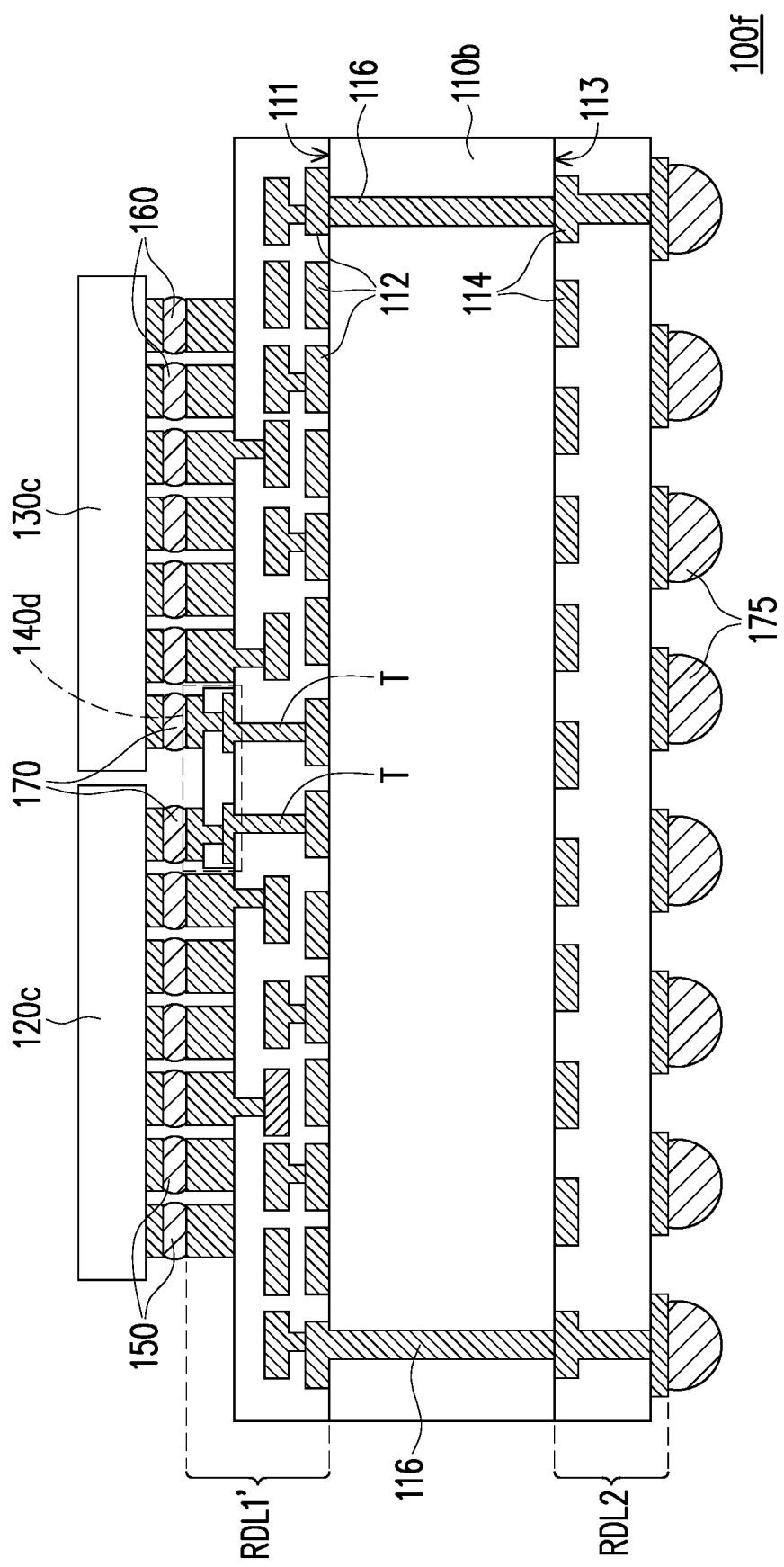
FIG. 6 is a schematic cross-sectional view of a chip package structure according to another embodiment of the invention.

FIG. 6 is a schematic cross-sectional view of a chip package structure according to another embodiment of the invention. Referring to FIG. 4 and FIG. 6 together, a chip package structure 100f of this embodiment is similar to the chip package structure 100d of FIG. 4 but differs in that, the first redistribution circuit layer RDL1' includes at least one second conductive via T (two conductive vias T are schematically shown). The second conductive vias T are electrically connected to a bridge 140d and the pads 112 of the substrate 110b. In other words, since the substrate 110b of this embodiment may be electrically connected to the bridge 140d through the second conductive vias T, a design flexibility can be improved.

In summary, in the chip package structure of the invention, the sizes of the bump are the same between each chip and the substrate. Because the first bumps and the second bumps have the same size, the assembly yield rate of the chips can be improved, and the chip package structure of the invention can have better structural reliability. Furthermore, the size of the third bumps may be the same as or different from the size of the first bumps depending on an arrangement position of the bridge. If the size the third bumps is the same as the size of the third bumps, when the first chip and the second chip are assembled with the substrate and the bridge, there is no need to consider the size of the connected bumps, and the assembly yield rate can be higher. Accordingly, the structural reliability of the chip package structure can be improved In addition, the properties of the first chip and the second chip may be different, so that the chip package structure of the invention achieves the effect of heterogeneous integration. Further, in addition to the first chip and the second chip (e.g., two logic chips), the chip set and the integrated passive element can also be disposed on the bridge, and the bridge can be electrically connected the through silicon vias on the chips. In this way, the chip package structure of the invention achieves the effect of heterogeneous integration.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The invention claimed is:

1. A chip package structure, comprising:
a substrate, having a first surface and a second surface opposite to each other;
a first chip, disposed on the first surface of the substrate, having a first active surface facing the first surface, and comprising a plurality of first pads disposed on the first active surface;
a second chip, disposed on the first surface of the substrate, having a second active surface facing the first surface, and comprising a plurality of second pads disposed on the second active surface;
a bridge, comprising a high-molecular polymer layer and a pad layer located on the high-molecular polymer layer;
a plurality of first bumps, disposed between the first chip and the substrate, wherein the first chip is electrically connected to the substrate through the first bumps;
a plurality of second bumps, disposed between the second chip and the substrate, wherein the second chip is electrically connected to the substrate through the second bumps, wherein the first bumps and the second bumps have the same size;
a plurality of third bumps, disposed between the first chip and the bridge and between the second chip and the bridge, wherein the first chip and the second chip are electrically connected to the pad layer of the bridge through the third bumps, respectively; and
a plurality of solder balls, disposed on the second surface of the substrate and electrically connected to the substrates;
wherein the first chip comprises at least one first through silicon via, the second chip comprises at least one second through silicon via, the at least one first through silicon via passes through the first chip and is connected to one of plurality of first pads, the at least one second through silicon via passes through the second chip and is connected to one of plurality of second pads, the first chip and the second chip are located between the bridge and the substrate, and the bridge is electrically connected to the at least one first through silicon via and the at least one second through silicon via through the third bumps.

2. The chip package structure according to claim 1, wherein a size of the third bumps is the same as a size of the first bumps.

3. The chip package structure according to claim 1, wherein a size of the third bumps is different from a size of the first bumps.

4. The chip package structure according to claim 1, wherein an orthogonal projection of the bridge on the substrate partially overlaps with an orthogonal projection of the first chip and the second chip on the substrate.

5. The chip package structure according to claim 1, further comprising:
a first redistribution circuit layer, disposed on the first surface of the substrate, and located between the first chip and the substrate and between the second chip and the substrate, wherein the first chip is electrically connected to the substrate through the first bumps and the first redistribution circuit layer.

6. The chip package structure according to claim 5, further comprising:
a second redistribution circuit layer, disposed on the second surface of the substrate and located between the substrate and the solder balls, the solder balls being electrically connected to the substrate through the second redistribution circuit layer, wherein the substrate comprises at least one conductive via electrically connected to the first redistribution circuit layer and the second redistribution circuit layer, and the second chip is electrically connected to the substrate through the second bumps and the second redistribution circuit layer.

7. The chip package structure according to claim 5, further comprising:
a chip set, disposed on the bridge, and electrically connected to the at least one first through silicon via of the first chip through the bridge and the third bumps.

8. The chip package structure according to claim 5, further comprising:
an integrated passive element, disposed on the bridge, and electrically connected to the at least one second through silicon via of the second chip through the bridge and the third bumps.

9. A chip package structure, comprising:
a substrate, having a first surface and a second surface opposite to each other;
a first chip, disposed on the first surface of the substrate, having a first active surface facing the first surface, and comprising a plurality of first pads disposed on the first active surface;
a second chip, disposed on the first surface of the substrate, having a second active surface facing the first surface, and comprising a plurality of second pads disposed on the second active surface;
a bridge, comprising a high-molecular polymer layer and a pad layer located on the high-molecular polymer layer;
plurality of first bumps, disposed between the first chip and the substrate wherein the first chip is electrically connected to the substrate through the first bumps;
a plurality of second bumps, disposed between the second chip and the substrate, wherein the second chip is electrically connected to the substrate through the second bumps, wherein the first bumps and the second bumps have the same size;
a plurality of third bumps, disposed between the first chip and the bridge and between the second chip and the bridge, wherein the first chip and the second chip are electrically connected to the pad layer of the bridge through the third bumps, respectively;
a plurality of solder balls, disposed on the second surface of the substrate and electrically connected to the substrate; and
a first redistribution circuit layer, disposed on the first surface of the substrate, the bridge and the first redistribution circuit layer being located between the first chip and the substrate and between the second chip and the substrate, wherein the first chip is electrically connected to the substrate through the first bumps and the first redistribution circuit layer, wherein the first redistribution circuit layer comprises at least one second conductive via, electrically connected to the bridge and the substrate.

10. The chip package structure according to claim 9, further comprising:
a second redistribution circuit layer, disposed on the second surface of the substrate and located between the substrate and the solder balls, the solder balls being electrically connected to the substrate through the second redistribution circuit layer, wherein the substrate comprises at least one first conductive via electrically connected to the first redistribution circuit layer and the second redistribution circuit layer, and the second chip is electrically connected to the substrate through the second bumps and the second redistribution circuit layer.

11. The chip package structure according to claim 9, wherein the bridge is embedded in the first redistribution circuit layer or disposed on the first redistribution circuit layer.

* * * * *